US010177465B2

(12) United States Patent
Hirayama et al.

(10) Patent No.: US 10,177,465 B2
(45) Date of Patent: Jan. 8, 2019

(54) ELECTRICALLY CONDUCTIVE MATERIAL

(71) Applicant: DEXERIALS CORPORATION, Tokyo (JP)

(72) Inventors: Kenichi Hirayama, Utsunomiya (JP); Hiromi Kubode, Tokyo (JP); Koji Ejima, Utsunomiya (JP)

(73) Assignee: DEXERIALS CORPORATION, Tokyo (JP)

(*) Notice: Subject to any disclaimer, the term of this patent is extended or adjusted under 35 U.S.C. 154(b) by 0 days.

(21) Appl. No.: 15/523,592

(22) PCT Filed: Oct. 28, 2015

(86) PCT No.: PCT/JP2015/080327
§ 371 (c)(1),
(2) Date: May 1, 2017

(87) PCT Pub. No.: WO2016/068165
PCT Pub. Date: May 6, 2016

(65) Prior Publication Data

US 2017/0310020 A1 Oct. 26, 2017

(30) Foreign Application Priority Data

Oct. 29, 2014 (JP) ................................ 2014-220448
Oct. 13, 2015 (JP) ................................ 2015-201767

(51) Int. Cl.
*H05K 1/09* (2006.01)
*H01R 4/18* (2006.01)
(Continued)

(52) U.S. Cl.
CPC ............ *H01R 4/188* (2013.01); *C23C 18/32* (2013.01); *H01B 1/22* (2013.01)

(58) Field of Classification Search
CPC ........... H01R 4/188; H01R 1/22; C23C 18/32
(Continued)

(56) References Cited

U.S. PATENT DOCUMENTS 4,740,657 A * 4/1988 Tsukagoshi .............. H01B 1/22 174/84 R
4,857,668 A * 8/1989 Buonanno ........... H05K 9/0015 174/354

(Continued)

FOREIGN PATENT DOCUMENTS

JP S62-206772 A 9/1987
JP 2001-332136 A 11/2001

(Continued)

OTHER PUBLICATIONS

Feb. 2, 2016 Search Report issued in International Patent Application No. PCT/JP2015/080327.

(Continued)

*Primary Examiner* — William H Mayo, III
(74) *Attorney, Agent, or Firm* — Oliff PLC

(57) ABSTRACT

An electrically conductive material with which excellent conduction reliability can be achieved for an oxide layer. The electrically conductive material contains electrically conductive particles including resin core particles, a plurality of electrically insulating particles being disposed on the surface of the resin core particles and forming protrusions, and an electrically conductive layer being disposed on the surface of the resin core particles and the electrically insulating particles, a Mohs' hardness of the electrically insulating particles being greater than 7. As a result, the electrically conductive particles pierce and sufficiently penetrate the oxide layer of the electrode surface so that excellent conduction reliability can be achieved.

16 Claims, 3 Drawing Sheets

(51) Int. Cl.
*C23C 18/32* (2006.01)
*H01B 1/22* (2006.01)

(58) Field of Classification Search
USPC .................. 174/257, 258, 259, 126.1, 126.2
See application file for complete search history.

(56) References Cited

U.S. PATENT DOCUMENTS 5,006,666 A * 4/1991 Laborie .................. B29C 55/30 174/357
5,142,101 A * 8/1992 Matsuzaki ........... H05K 9/0015 174/354
5,902,956 A * 5/1999 Spies .................. H05K 9/0015 174/358
8,395,052 B2 * 3/2013 Ishimatsu ............. H05K 3/323 174/126.2
2001/0030019 A1 * 10/2001 Saitoh .................. B32B 37/144 156/274.4
2007/0092698 A1 * 4/2007 Ishida ..................... B22F 1/025 428/172

FOREIGN PATENT DOCUMENTS

JP 2013-149611 A 8/2013
JP 2013-149613 A * 8/2013 ............... H01B 1/22
JP 2013-149613 A 8/2013
JP 2015-057757 A 3/2015
WO 2007/058159 A1 5/2007
WO WO2007-058159 A * 5/2007 ............... H01B 1/00
WO 2013/094636 A1 6/2013
WO WO2013-094636 A * 6/2013 ............... H01B 1/22

OTHER PUBLICATIONS

Feb. 27, 2017 International Preliminary Report on Patentability issued in International Patent Application No. PCT/JP2015/080327.

* cited by examiner

ELECTRICALLY CONDUCTIVE MATERIAL

TECHNICAL FIELD

The present invention relates to an electrically conductive material for electrically connecting circuit members to one another. The present application asserts priority based upon Japanese Patent Application No. 2014-220448 filed in Japan on Oct. 29, 2014 and Japanese Patent Application No. 2015-201767 filed in Japan on Oct. 13, 2015, and hereby incorporates these applications by reference.

BACKGROUND ART

In recent years, IZO (indium zinc oxide) has been used as wiring for circuit members instead of ITO (indium tin oxide), which is expensive to produce. IZO wiring has a smooth surface, and an oxide layer (passive) is formed on the surface. In addition, in aluminum wiring, for example, a protective layer made of an oxide layer such as $TiO_2$ may be formed on the surface in order to prevent corrosion.

However, since oxide layers are hard, electrically conductive particles do not pierce and sufficiently penetrate the oxide layer of a conventional electrically conductive material, so sufficient conduction reliability cannot be achieved.

CITATION LIST

Patent Literature

Patent Document 1: Japanese Unexamined Patent Application Publication No. 2013-149613A

SUMMARY OF INVENTION

Technical Problem

The present invention was conceived in light of such conventional circumstances, and the present invention provides an electrically conductive material with which conduction reliability can be achieved for an oxide layer.

Solution to Problem

As a result of conducting dedicated research, the present inventors discovered that excellent conduction resistance can be achieved by making the Mohs' hardness of electrically insulating particles which form protrusions of electrically conductive particles greater than a prescribed value.

That is, the electrically conductive material of the present invention contains electrically conductive particles provided with resin core particles, a plurality of electrically insulating particles being disposed on a surface of the resin core particles and forming protrusions, and an electrically conductive layer being disposed on a surface of the resin core particles and the electrically insulating particles, a Mohs' hardness of the electrically insulating particles being greater than 7.

In addition, the connection structure of the present invention includes a first circuit member and a second circuit member, where a terminal of the first circuit member and a terminal of the second circuit member are connected by electrically conductive particles including resin core particles, a plurality of electrically insulating particles being disposed on a surface of the resin core particles and forming protrusions, and an electrically conductive layer being disposed on a surface of the resin core particles and the electrically insulating particles, and a Mobs' hardness of the electrically insulating particles is greater than 7.

Further, the production method for tyre connection structure of the present invention includes crimping a terminal of a first circuit member and a terminal of a second circuit member via an electrically conductive material containing electrically conductive particles provided with resin core particles, a plurality of electrically insulating particles being disposed on a surface of the resin core particles and forming protrusions, and an electrically conductive layer being disposed on a surface of the resin core particles and the electrically insulating particles, a Mobs' hardness of the electrically insulating particles being greater than 7.

Advantageous Effects of Invention

With the present invention, since the Mohs' hardness of the electrically insulating particles forming protrusions is large, the electrically conductive particles pierce and sufficiently penetrate the oxide layer of the electrode surface so that excellent conduction reliability can be achieved.

DESCRIPTION OF EMBODIMENTS

Embodiments of the present invention will be described in detail hereinafter in the following order with reference to the drawings.

1. Electrically conductive particles
2. Electrically conductive material
3. Production method for connection structure
4. Examples 1. Electrically Conductive Particles The electrically conductive particles of this embodiment includes resin core particles, a plurality of electrically insulating particles being disposed on the surface of the resin core particles and forming protrusions, and an electrically conductive layer being disposed on the surface of the resin core particles and the electrically insulating particles, the Mohs' hardness of the electrically insulating particles being greater than 7. As a result, the electrically conductive particles pierce and sufficiently penetrate the oxide layer of the electrode surface so that excellent conduction reliability can be achieved. In particular, when the circuit member serving as an adherend is a plastic substrate with a low modulus of elasticity such as a PET (polyethylene terephthalate) substrate, low resistance can be achieved by reducing the effects of base material deformation without increasing the pressure at the time of crimping, which is extremely effective.

First Configuration Example

Figure 1:
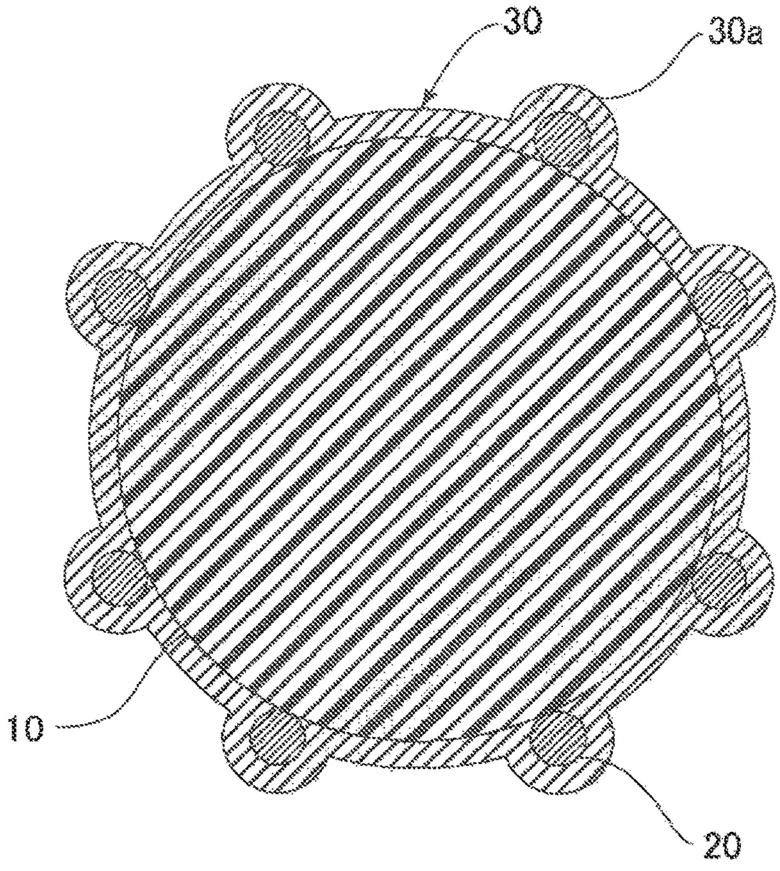
FIG. 1 is a cross-sectional view illustrating an outline of a first configuration example of electrically conductive particles.

FIG. 1 is a cross-sectional view illustrating an outline of a first configuration example of electrically conductive particles. The electrically conductive particles of the first configuration example includes resin core particles 10, a plurality of electrically insulating particles 20 being adhered to the surface of the resin core particles 10 so as to form a core material for protrusions 30*a,* and an electrically conductive layer 30 for covering the resin core particles 10 and the electrically insulating particles 20.

Examples of the resin core particles 10 include benzoguanamine resins, acrylic resins, styrene resins, silicone resins, and polybutadiene resin, and a copolymer having a structure in which at least two or more repeating units based on the monomers forming these resins may be used. Of these, it is preferable to use a copolymer obtained by combining divinylbenzene, tetramethylol methane tetraacrylate, and styrene.

In addition, the compressive elasticity modulus of the resin core particles 10 when compressed by 20% (20% K-value) is preferably from 500 to 20000 N/mm$^2$. As a result of the 20% K-value of the resin core particles 10 being within the range described above, the protrusions can pierce the oxide of the electrode surface. Therefore, the electrodes make sufficient contact with the electrically conductive layer of the electrically conductive, which makes it possible to reduce the contact resistance between electrodes.

The compressive elasticity modulus (20% K-value) of the resin core particles 10 can be measured as follows. Using a microcompression testing machine, electrically conductive particles are compressed on a smooth penetrator end face of a column (diameter: 50 μm, made of diamond) under conditions with a compression rate of 2.6 mN/sec and a maximum test load of 10 gf. The load value (N) and the compression displacement (mm) at this time are measured. The compressive elasticity modulus (20% K-value) is determined by the formula below from the obtained measurement values. A "Fischer's Corp. H-100" manufactured by the Fischer Corporation or the like is used as a microcompression testing machine.

$$\text{K-value (N/mm}^2) = (3/2^{1/2}) \cdot F \cdot S^{-3/2} \cdot R^{-1/2}$$

F: load value (N) When electrically. conductive particles are compressively deformed by 20%

S: compression displacement (when electrically conductive particles are compressively deformed by 20%

R: radius (mm) of electrically conductive particles

The average particle size of the resin core particles 10 is from 2 to 10 μm. In this specification, the average particle size refers to the particle size (D50) at an integrated value of 50% in the particle size distribution determined by a laser diffraction/scattering method.

A plurality of electriclly insulating particles 20 are adhered to the surface of the resin core particles 10 so as to form a core material of protrusions 30a for piercing the oxide layer of the electrode surface. The Mohs' hardness of the electrically insulating particles 20 is greater than 7 and preferably not less than 9. When the hardness of the electrically insulating particles 20 is high, the protrsions 30a can pierce the oxide of the electrode surface. in addition, when the core material of the protrusions 30a consists of the electrically insulating particles 20, there are fewer migration factors in comparison to when electrically conductive particles are used.

Examples of the electrically insulating particles 20 include zirconia (Mohs' hardness: 8 to 9), alumina (Mohs' hardness: 9), tungsten carbide (Mohs' hardness: 9), and diamond (Mohs' hardness: 10). These may be used alone, or two or more types may be used in combination. Of these, it is preferable to use alumina from the perspective of economic efficiency.

In addition, the average particle size of the electrically insulating particles 20 is preferably not less than 50 nm and not greater than 250 nm and more preferably not less than 100 nm and not greater than 200 nm. Further, the number of protrusions formed on the surface of the resin core particles 20 is preferably from 1 to 500 and more preferably from 30 to 200. By forming a prescribed number of protrusions 30*a* on the surface of the resin core particles 20 using electrically insulating particles 20 having such an average particle size, the protrusions 30*a* can pierce the oxide of the electrode surface, which makes it possible to effectively reduce the connection resistance between electrodes.

The electrically conductive layer 30 covers the resin. core particles 10 and the electrically insulating particles 20 and has protrusions 30a which are raised by the plurality of electrically insulating particles 20. The electrically conductive layer 30 is preferably nickel or a nickel alloy. Examples of nickel alloys include Ni—W—B, Ni—W—P, Ni—W, Ni—B, and Ni—P. Of these, it is preferable to use Ni—W—B, which has low resistance.

In addition, the thickness of the electrically conductive layer 30 is preferably not less than 50 nm and not greater than 250 nm and more preferably not less than 80 nm and not greater than 150 nm. When the thickness of the electrically conductive layer 30 is too small, it becomes difficult to make the layer function as electrically conductive particles, and when the thickness is too large, the height of the protrusions 30*a* is diminished.

Figure 2:
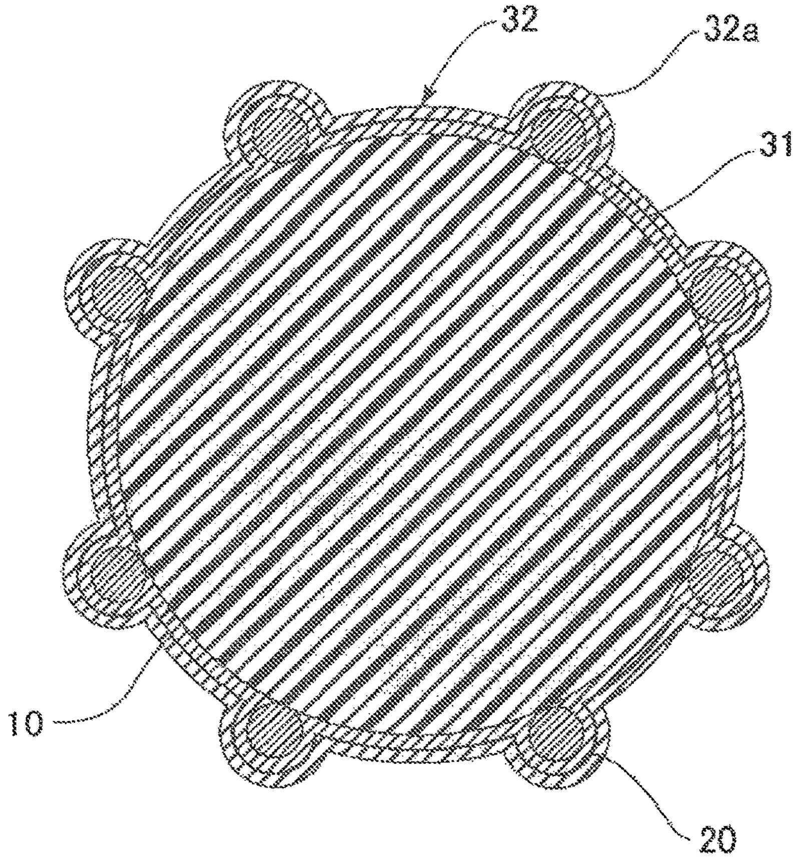
FIG. 2 is a cross-sectional view illustrating an outline of a second configuration example of electrically conductive particles.

The electrically conductive particles of the first configuration example can be obtained by a method. of first adhering the electrically insulating particles 20 to the surface of the resin core particles 10 and then forming the electrically conductive layer 30. An example of a method for adhering the electrically insulating particles 20 to the surface of the resin core particles 10 involves adding the electrically insulating particles 20 to a dispersion of the resin core particles 10 and accumulating and adhering the electrically insulating particles 20 to the surface of the resin core particles 10 using Van der Walls force. Examples of methods for forming the electrically conductive layer include a method using electroless plating, a method using electroplating, and a method using physical vapor deposition. Of these, a method using electroless plating is preferable in that the electrically conductive layer can be formed easily, Second Configuration Example FIG. 2 is a cross-sectional view illustrating an outline of a second configuration example of electrically conductive particles. The electrically conductive particles of the second configuration example inludes resin core particles 10, a plurality of electrically insulating particles 20 being adhered to the surface of the resin core particles 10 so as to form a core material for protrusions 32*a,* a first electrically conductive layer 31 for covering the surface of the resin core particles 10 and the electrically insulating particles 20, and a second electrically conductive layer 32 for covering the electrically conductive layer 31. That is, the second configuration example is one in which the electrically conductive layer 30 of the first configuration example has a two-layer structure. By forming the electrically conductive layer with a two-layer structure, it is possible to enhance the adhesion of the second electrically conductive layer 32 constituting the outermost shell and to thereby reduce conduction resistance.

The resin core particles 10 and the electrically insulating particles 20 are the same as those in the first configuration example, so explanations thereof will be omitted here.

The first electrically conductive layer 31 covers the surface of the resin core particles 10 and the electrically insulating particles 20 and forms a substrate for the second electrically conductive layer 32. The first electrically conductive layer 31 is not particularly limited as long as the adhesion of the second electrically conductive layer 32 can be enhanced, and examples thereof include nickel, nickel alloys, copper, and silver.

The second electrically conductive layer 32 covers the first electrically conductive layer 31 and has protrusions 32*a* which are raised by the plurality of electrically insulating particles 20. As in the first configuration example, the second electrically conductive layer 32 is preferably nickel or a nickel alloy. Examples of nickel alloys include Ni—W—B, Ni—W—P, Ni—W, Ni—B, and Ni—P. Of these, it is preferable to use Ni—W—B, which has low resistance.

In addition, as in the case of the electrically conductive layer 30 of the first configuration example, the total thickness of the first electrically conductive layer 31 and the second electrically conductive layer 32 is preferably not less than 50 nm and not greater than 250 nm and more preferably not less than 80 nm and not greater than 150 mm. When the total thickness is too small, it is difficult to make the layers function as electrically conductive particles, and when the total thickness is too large, the height of the protrusions 32*a* is diminished.

The electrically conductive particles of the second configuration example can be obtained by a method of adhering the electrically insulating particles 20 to the surface of the resin core particles 10, forming the first electrically conductive layer 31, and then forming the second electrically conductive layer 32. An example of a method for adhering the electrically insulating particles 20 to the surface of the resin core particles 10 involves adding the electrically insulating particles 20 to a dispersion of the resin core particles 10 and accumulating and adhering the electrically insulating particles 20 to the surface of the resin core particles 10 using Van der Walls force. In addition, examples of methods for forming the first electrically conductive layer 31 and the second electrically conductive layer 32 include a method using electroless plating, a method using electroplating, and a method using physical vapor deposition, Of these, a method using electroless plating is preferable in that the electrically conductive layer can be formed easily.

Third Configuration Example

Figure 3:
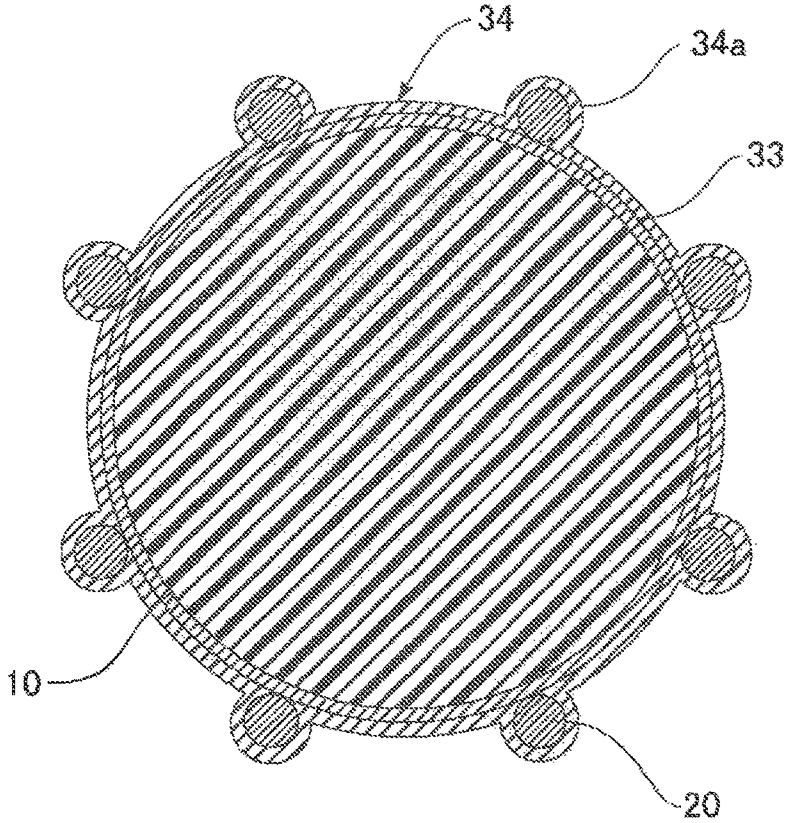
FIG. 3 is a cross-sectional view illustrating an outline of a third configuration example of electrically conductive particles.

FIG. 3 is a cross-sectional view illustrating an outline of a third configuration example of electrically conductive particles, The electrically conductive particles of the third configuration example includes resin core particles 10, a first electrically conductive layer 33 for covering the surface of the resin core particles 10, a plurality of electrically insulating particles 20 being adhered to the surface of the first electrically conductive layer 33 so as to form a core material for protrusions 34*a*, and a second electrically conductive layer 34 for covering the surface of the first electrically conductive layer 33 and the electrically conductive particles 20. That is, in the third configuration example, the electrically insulating particles 20 are adhered to the surface of the first electrically conductive layer 33, and a second electrically conductive layer 34 is further formed. As a result, it is possible to prevent the electrically insulating particles 20 from penetrating the resin core particles 10 at the time of crimping, which makes it possible for the protrusions to easily pierce the oxide layer of the electrode surface.

The resin core particles 10 and the electrically insulating particles 20 are the same as those in the first configuration example, so explanations thereof will be omitted here.

The first electrically conductive layer 33 covers the surface of the resin core particles 10 and forms an adhesion surface for the electrically insulating particles 20 and a substrate for the second electrically conductive layer 34. The first electrically conductive layer 33 is not particularly limited as long as the adhesion of the second electrically conductive layer 34 can be enhanced. Examples thereof include nickel, nickel alloys, copper, and silver.

In addition, the thickness of the first electrically conductive layer 33 is preferably not less than 10 um and not greater than 200 nm and more preferably not less than 50 nm and not greater than 150 nm, When the thickness is too large, the effective of the elasticity of the resin core particles 10 is diminished, so the conduction reliability is diminished.

The second electrically conductive layer 34 covers the electrically insulating particles 20 and the first electrically conductive layer 33 and has protrusions 34a which are raised by the plurality of electrically insulating particles 20. As in the case of the first configuration example, the second electrically conductive layer 34 is preferably nickel or a nickel alloy. Examples of nickel alloys include Ni—W—B, Ni—W—P, Ni—W, Ni—B, and Ni—P. Of these, it is preferable to use Ni—W—B, which has low resistance.

In addition, as in the case of the electrically conductive layer 30 of the first configuration example, the thickness of the second electrically conductive layer 34 is preferably not less than 50nm and not greater than 250 nm and more preftrably not less than 80 mm and not greater than 150 nm. When the total thickness is too small, it is difficult to make the layers function as electrically conductive particles, and when the total thickness is too large, the height of the protrusions 34*a* is diminished.

The electrically conductive particles of the third configuration example can be obtained by a method of forming the first electrically conductive layer 33 on the surface of the resin core particles 10, adhering the electrically insulating particles 20, and then forming the second electrically conductive layer 34. In addition, an example of a method for adhering the electrically insulating particles 20 to the surface of the first electrically conductive layer 33 involves adding the electrically insulating particles 20 to a dispersion of the resin core particles 10 where the first electrically conductive layer 33 is formed and accumulating and adhering the electrically insulating particles 20 to the surface of the first electrically conductive layer 33 using Van der Walls force. Examples of methods for forming the first electrically conductive layer 33 and the second electrically conductive layer 34 include a method using electroless plating, a method using electroplating, and a method using physical vapor deposition. Of these, a method using electroless plating is preferable in that the electrically conductive layer can be formed easily.

2. Electrically Conductive Material

The electrically conductive material of this embodiment contains electrically conductive particles including resin core particles, a plurality of electrically insulating particles being disposed on the surface of the resin core particles and forming protrusions, and an electrically conductive layer being disposed on the surface of the resin core particles and the electrically insulating particles, the Mohs' hardness of the electrically insulating particles being greater than 7. The form of the electrically conductive material may be a film or a paste, examples of which include an anisotropic conductive film (ACF) and an anisotropic conductive paste (ACP).

In addition, examples of the type of curing of the electrically conductive material include thermosetting, photocuring, and photo-heat combination curing.

An example of thermosetting anisotropic conductive film with a two-layer structure in which an ACF layer containing electrically conductive particles and an NCF (non-conductive film) not containing electrically conductive particles are laminated will be given. In addition, the thermosetting anisotropic conductive film may be a cationic-curing type, an anionic-curing type, a radical curing type, or a combination thereof, for example, but an anionic-curing type anisotropic conductive film will be described here.

In an anionic-curing type anisotropic conductive film, the ACF layer and the NCF layer contain a film-forming resin, an epoxy resin, and an anionic polymerization initiator as binders.

The film-forming resin corresponds to a high-molecular-weight resin having an average molecular weight of not less than 10000, for example, and an average molecular weight of from approximately 10000 to approximately 80000 is preferable from the perspective of film formability. Examples of film-forming resins include various resins such as phenoxy resins, polyester resins, polyurethane resins, polyester urethane resins, acrylic resins, polyimide resins, and butyral resins. These may be used alone, or two or more types may be used in combination. Of these, a phenoxy resin is preferably used from the standpoints of film formation state, connection reliability, and the like.

An epoxy resin forms a three-dimensional mesh structure so as to provide good heat resistance and adhesiveness, and a solid epoxy resin and a liquid epoxy resin are preferably used in combination. Here, a solid epoxy resin refers to an epoxy resin which is a solid at room temperature. In addition, a liquid epoxy resin refers to an epoxy resin which is a liquid at room temperature. Room temperature refers to the temperature range of from 5 to 35° C. prescribed by JIS Z 8703.

The solid epoxy resin is not particularly limited as long as it is compatible with the liquid epoxy resin and is a solid at room temperature, and examples thereof include bisphenol A epoxy resins, bisphenol F epoxy resins, polyfugnctional epoxy resins, dicyclopentadiene epoxy resins, novolac phenol epoxy resins, biphenol epoxy resins, and naphthalene epoxy resins. One type of these may be used alone, or two or more types may be used in combination. Of these, it is preferable to use a bisphenol A epoxy resin. A specific example of a commercially available product is product name "YD-014" of Nippon Steel & Sumikin Chemical Co., Ltd.

The liquid epoxy resin is not particularly limited as long as it is a liquid at room temperature, and examples include bisphenol A epoxy resins, bisphenol F epoxy resins, novolac phenol epoxy resins and naphthalene epoxy resins. One type of these may be used alone, or two or more types may be used in combination. In particular, it is preferable to use a bisphenol A epoxy resin from the perspective of tack of the film, flexibility or the like. A specific example of a commercially available product is product name "EP828" of the Mitsubishi Chemical Corporation.

A publicly known curing agent that is ordinarily used can be used as the anionic polymerization initiator. Examples include organic acid dihydrazide, dicyandiamide, amine compounds, polyamide amine compounds, cyanate ester compounds, phenol resins, acid anhydride, carboxylic acid, tertiary amine compounds, imidazole, Lewis acid, Bronsted acid salts, polymercaptan-based curing agents, urea resins, melamine resins, isocyanate compounds, and block isocyanate compounds. One type of these may be used alone, or two or more types may be used in combination. Of these, it is preferable to use a microcapsule-type latent curing agent formed by using an imidazole-modified substance as a core and covering the surface thereof with polyurethane. A specific example of commercially available product is product name "Novacure 3941 HP" of the Asahi Kasei E-Materials Corporation.

In addition, stress relaxation agents, silane coupling agents, inorganic fillers, or the like may also be compounded as necessary as binders. Examples of stress relaxation agents include hydrogenated styrene-butadiene block copolymers and hydrogenated styrene-isoprene block copolymers. Examples of silane coupling agents include epoxy-based, methacryloxy-based, amino-based, vinyl-based, mercapto-sulfoxide-based, and ureide-based silane coupling agents. Examples of inorganic fillers include silica, talc, titanium oxide, calcium carbonate, and magnesium oxide.

3. Production Method for Connection Structure

The production method for the connection structure of this embodiment includes crimping a terminal of a first circuit member and a terminal of a second circuit member via an electrically conductive material containing electrically conductive particles including resin core particles, a plurality of electrically insulating particles being disposed on a surface of the resin core particles and forming protrusions, and an electrically conductive layer being disposed on a surface of the resin core particles and the electrically insulating particles, the Mohs' hardness of the electrically insulating particles being greater than 7. As a result, it is possible to obtain a connection structure formed by the connection of a terminal of a first circuit member and a terminal of a second circuit member by the electrically conductive particles described above.

The first circuit member and the second circuit member are not particularly limited and may be selected appropriately in accordance with the purpose. Examples of the first circuit member include plastic substrates, glass substrates, and printed wiring boards (PWB) for LCD (liquid crystal display) panel applications, plasma display panel (PDP) applications, or the like. in addition, examples of the second. circuit member include flexible printed circuits (FPCs) such as ICs (integrated circuits) and COFs (chips on. film) and tape carrier package (TCP) substrates.

Figure 4:
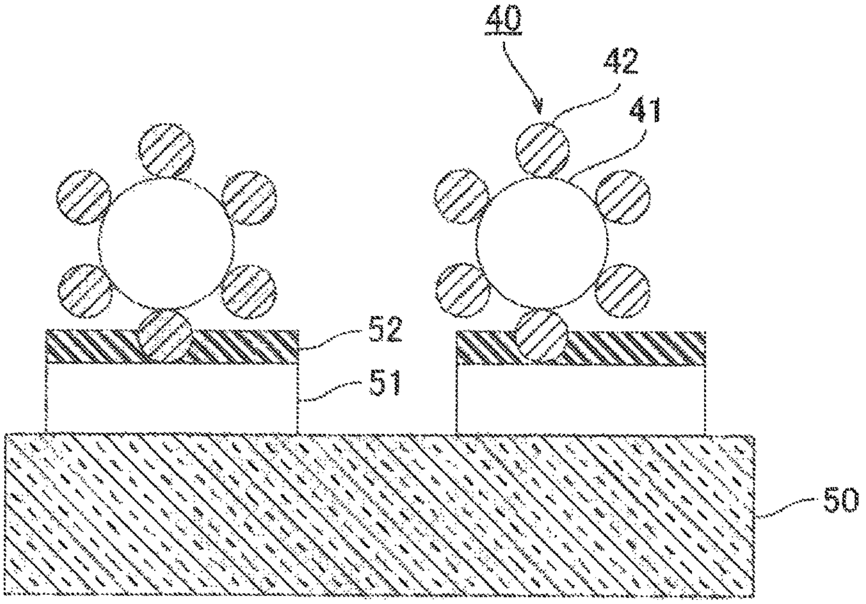
FIG. 4 is a cross-sectional view illustrating an outline of electrically conductive particles at the time of crimping.

FIG. 4 is a cross-sectional view illustrating an outline of electrically conductive particles at the time of crimping. The electrically conductive layer is omitted in FIG. 4. Electrically conductive particles 40 can pierce an oxide layer 52 formed on a terminal 51 of a first circuit member 50 since a plurality of electrically insulating particles 42 forming protrusions are disposed on the surface of resin core particles 41. The oxide layer 52 functions as a protective layer for preventing the corrosion of the wiring, examples of which include $TiO_2$, $SnO_2$, and $SiO_2$.

In this embodiment, the Mohs' hardness of the electrically insulating particles 41 is greater than 7, so it is possible to pierce the oxide layer 52 and to suppress the occurrence of wire cracking without increasing the pressure at the time of crimping. In particular, when the first circuit member 50 is a plastic substrate with a low modulus of elasticity such as a PET (polyethylene terephthalate) substrate, low resistance can be achieved by reducing the effects of base material deformation without increasing the pressure at the time of crimping, which is extremely effective. The modulus of elasticity' of a plastic substrate is determined while taking into consideration factors such as the flexibility required of the connector or the relationship between flexibility and the connection strength with electronic parts such as a driving circuit element 3 described below, but the modulus of elasticity is typically set to 2000 MPa to 4100 MPa.

In the crimping of the terminal of the first circuit member and the terminal of the second terminal member, the terminals are heat-pressed at a prescribed pressure for a prescribed amount of time by a crimping tool heated to a prescribed temperature from above the second circuit member so as to achieve final crimping. Here, the prescribed pressure is preferably not less than 10 MPa and not greater than 80 MPa from the perspective of preventing wire cracking in the circuit member. In addition, the prescribed temperature is the temperature of the anisotropic conductive film at the time of crimping and is preferably not lower than 80° C. and not higher than 230° C.

The crimping tool is not particularly limited and may be selected appropriately in accordance with the purpose. Pressing may be performed one time using a pressing member having a greater area than the object to be pressed, or pressing may be performed several times using a pressing member having a smaller area than the object to be pressed. The tip shape of the crimping tool is not particularly limited and may be selected appropriately in accordance with the purpose, and examples include a flat surface shape and a curved surface shape. When the tip shape is a curved surface shape, pressing is preferably performed along the curved surface shape.

In addition, heat-pressing may be performed after interposing a buffer material between the crimping tool and the second circuit member. By interposing a buffer material, it is possible to reduce pressing variation and to prevent the crimping tool from becoming contaminated, The buffer material is made of a sheet-like elastic material or plastic material. For example, a silicon rubber or ethylene tetrafluoride may be used.

With such a production method for a connection structure, since the Mohs' hardness of the electrically insulating particles is large, it is possible to pierce the oxide layer and to suppress the occurrence of wire cracking without increasing the pressure at the time of crimping. in addition, by forming the electrically conductive layer from a material with a high hardness such as Ni—W—B, it is possible to easily pierce the oxide layer and to further suppress the occurrence of wiring cracking without increasing the pressure at the time of crimping.

EXAMPLES

3. Examples

Examples of the present invention will be described hereinafter. In these examples, electrically conductive particles having protrusions were produced, and connection structures were produced using an anisotropic conductive film containing the electrically conductive particles. The conduction resistance and incidence of wire cracking of the connection structures were then evaluated. Note that the present invention is not limited to these The production of the anisotropic conductive film, the production of the connection structure, the measurement of the conduction resistance, and the calculation of the incidence of wire cracking were performed as follows.

Production of Anisotropic Conductive Film

An anisotropic conductive film with a two-layer structure in which an ACF layer and an NCF layer were laminated was produced, First, 20 parts by mass of a phenoxy resin (YP50, Nippon Steel & Sumikin Chemical Co., Ltd.), 30 parts by mass of a liquid epoxy resin (EP828, Mitsubishi Chemical Corporation), 10 parts by mass of a solid epoxy resin (YD-014, Nippon Steel & Sumikin Chemical Co., Ltd.), 30 parts by mass of a microcapsule-type latent curing agent (Novacure 3941H, Asahi Kasei E-Materials Corporation), and 10 parts by mass of electrically conductive particles were compounded to obtain an ACF layer having a thickness of 6 μm. Next, 2.0 parts by mass of a phenoxy resin (YP50, Nippon Steel & Sumikin Chemical Co., Ltd.), 30 parts by mass of a liquid epoxy resin (EP828, Mitsubishi Chemical Corporation), 10 parts by mass of a solid epoxy resin (YD-014, Nippon Steel & Sumikin Chemical Co., Ltd.), and 30 parts by mass of a microcapsule-type latent curing agent (Novacure 3941H, Asahi Kasei E-Materials Corporation) were compounded to obtain an NCF layer having a thickness of 12 μm. The ACF layer and the NCF layer were then attached to one another to obtain an anisotropic conductive film with a. two-layer structure having a thickness of 18 μm.

Production of Connection Structure

A $TiO_2$/Al coated glass substrate (0.3 mmt, $TiO_2$ thickness: 50 nm, Al thickness: 300 nm), a $TiO_2$/Al coated PET (polyethylene terephthalate) substrate (0.3 mmt, $TiO_2$ thickness: 50 mm, Al thickness: 300 nm), and an IC (1.8 mm×20 mm, T: 0.3 mm, Au-plated bump: 30 μm×85 μm, h=15 μm) were prepared as evaluation base materials, The crimping conditions were 5 sec at 190° C. and 60 MPa and 5 sec at 190° C. and 100 MPa.

First, an anisotropic conductive film slit to a width of 1.5 mm was temporarily attached to the $TiO_2$/Al coated glass substrate or the $TiO_2$/Al coated PET substrate, and after a release PET film was peeled off, the IC was crimped under the prescribed crimping conditions using a crimping tool to obtain a connection structure.

Measurement of Conduction Resistance

The initial conduction resistance (Ω) of the connection structure was measured using a digital multimeter (product name: Digital Multimeter 7561, manufactured by Yokogawa Electric Corporation). In addition, after a reliability test was performed by leaving the connection structure for 500 h in a high-temperature, high-humidity environment at 85° C. and 85% RH, the conduction resistance (Ω) of the connection structure was measured.

Incidence of Wire Cracking

Twenty discretionary spots of the wiring on the substrate side of the connection structure were observed with a metal microscope. The number of wire cracks was counted, and the incidence was calculated.

Overall Assessment

Cases in which the difference between the initial conduction resistance and the conduction resistance after the reliability test was not greater than 0.3Ω and the incidence of wire cracking was 0% were evaluated as "OK", and all other cases were evaluated as "NG",

Example 1

Divinylbenzene resin particles were produced as follows as resin core particles. A microparticulate dispersion was obtained by adding benzoyl peroxide as a polymerization initiator to a solution having an adjusted mixing ratio of divinylbenzene, styrene, and butyl methacrylate, heating the mixture while uniformly stirring at a high speed, and performing a polymerization reaction. The microparticulate solution was filtered and then dried under reduced pressure to obtain a block as an aggregate of microparticles. The block was then pulverized to obtain divinylbenzene resin particles having an average particle size of 3.0 μm. The compressive elasticity modulus of the resin core particles when compressed by 20% (20% K-value) was 12000 $N/mm^2$.

In addition, alumina ($Al_2O_3$) having an average particle size of 150 nm was used as electrically insulating particles. Further, a nickel plating solution (pH 8.5) containing 0.23 mol/L of nickel sulfate, 0.25 mol/L of dimethylarnine borane, and 0.5 mol/L, of sodium citrate was used as a plating solution for an electrically conductive layer.

First, after 10 parts by mass of the resin core particles were dispersed in 100 parts by mass of an alkaline solution containing 5 wt. % of a palladium catalyst solution with an ultrasonic distributor, the solution was filtered and the resin core particles were extracted. Next, 10 parts by mass of the resin core particles were added to 100 parts by mass of a 1 wt. % solution of dimethylamine borane to activate the surface of the resin core particles. After the resin core particles were then sufficiently washed with water, they were added to 500 parts by mass of distilled water and dispersed to obtain a dispersion containing resin core particles to which palladium was adhered.

Next, 1 g of electrically insulating particles were added to the dispersion over the course of 3 minutes to obtain a slurry containing particles to which the electrically insulating particles were adhered. Electroless nickel plating was then performed by gradually dropping a nickel plating solution into the slurry while stirring the slurry at 60° C. After it was confirmed that the foaming of hydrogen had stopped, the particles were filtered, washed with water, alcohol-exchanged, and vacuum-dried to obtain electrically conductive particles having protrusions formed from alumina and a Ni—B plated electrically conductive layer. When the electrically conductive particles were observed with a scanning electron microscope (SEM), the average particle size was from 3 to 4 μm, and the number of protrusions per particle was approximately 70. The thickness of the electrically conductive layer was approximately 100 nm.

As shown in Table 1, a $TiO_2$/Al coated glass substrate and an IC were crimped under crimping conditions for 5 sec at 190° C. and 60 MPa using an anisotropic conductive film to which these electrically conductive particles were added so as to obtain a connection structure. The initial resistance of the connection structure was 0.6Ω, and the resistance after a reliability test was 0.9Ω. The incidence of wire cracking was 0%, and the overall assessment was OK.

Example 2

As shown in Table 1, a $TiO_2$/Al coated PET substrate and an. IC were crimped under crimping conditions for 5 sec at 190° C. and 60 MPa using an anisotropic conductive tilm to whith the same electrically conductive particles as those in Example 1. were added so as to obtain a connection structure. The initial resistance of the connection structure was 0.7Ω, and the resistance after a reliability test was 1.0Ω. The incidence of wire cracking was 0%, and the overall assessment was OK.

Example 3

A Ni—W—B plating solution (pH 8.5) containing 0.23 mol/L of nickel sulfate, 0.25 mol/L of dimethylamine borane, 0.5 mol/L of sodium citrate, and 0.35 mol/L of sodium tungstate was used as a plating solution for an electrically conductive layer. Otherwise, electrically conductive particles having protrusions made of alumina and a Ni—W—B plated electrically conductive layer were obtained in the same manner as in Example 1. When the electrically conductive particles were observed with a scanning electron microscope, the average particle size was from 3 to 4 μm, and the number of protrusions per particle was approximately 70 . The thickness of the electrically conductive layer was approximately 100 nm.

As shoves in Table 1, a $TiO_2$/Al coated glass substrate and an IC were crimped under crimping conditions for 5 sec at 190° C. and 60 MPa using an anisotropic conductive film to which these electrically conductive particles were added so as to obtain a connection structure. The initial resistance of the connection structure was 0.3Ω, and the resistance after a reliability test was 0.5Ω. The incidence of wire cracking was 0%, and the overall assessment was OK.

Example 4

As shown in Table 1, a $TiO_2$/Al coated PET substrate and an IC were crimped under crimping conditions for 5 sec at 190° C. and 60 MPa using an anisotropic conductive film to which the same electrically conductive particles as those in Example 3 were added so as to obtain a connection structure. The initial resistance of the connection structure was 0.6Ω, and the resistance after a reliability test was 0.8Ω. The incidence of wire cracking was 0%, and the overall assessment was OK.

Comparative Example 1

Silica ($SiO_2$) having an average particle size of 150 nm was used as electrically insulating particles. Otherwise, electrically conductive particles having protrusions made of silica and a Ni—B plated electrically conductive layer were obtained in the same manner as in Example 1. When the electrically conductive particles were observed with a scanning electron microscope, the average particle size was from 3 to 4 μm, and the number of protrusions per particle was approximately 70. The thickness of the electrically conductive layer was approximately 100 nm.

As shown in Table 1, a $TiO_2$/Al coated glass substrate and an IC were crimped under crimping conditions fbr 5 sec at 190° C. and 60 MPa using an anisotropic conductive film to which these electrically conductive particles were added so as to obtain a connection structure. The initial resistance of the connection structure was 1.5Ω, and the resistance after a reliability test was 3.0Ω. The incidence of wire cracking was 0%, and the overall assessment was NG.

Comparative Example 2

As shown in Table 1, a $TiO_2$/Al coated PET substrate and an IC were crimped under crimping conditions for 5 sec at 190° C. and 60 MPa using an anisotropic conductive film to which the same electrically conductive particles as those in Comparative Example 1 were added so as to obtain a connection structure. The initial resistance of the connection structure was 3.0Ω, and the resistance after a reliability test was 6.0Ω. The incidence of wire cracking was 0%, and the overall assessment was NG.

Comparative Example 3

Silica ($SiO_2$) having an average particle size of 150 nm was used as electrically insulating particles. In addition, a Ni—W—B plating solution (pH 8.5) containing 0.23 mol/L of nickel sulfate, 0.25 mol/L dimethylamine borane, 0.5 mol/L of sodium citrate, and 0.35 mol/L of sodium tungstate was used as a plating solution for an electrically conductive layer. Otherwise, electrically conductive particles having protrusions made of silica and a Ni—W—B plated electrically conductive layer were obtained in the same manner as in. Example I. When the electrically conductive particles were observed with a scanning electron microscope (SEM), the average particle size was from 3 to 4 μm, and the number of protrusions per particle was approximately 70. The thickness of the electrically conductive layer was approximately 100 nm.

As shown in Table 1, a $TiO_2$/Al coated glass substrate and an IC were crimped under crimping conditions for 5 sec at 190° C. and 60 MPa using an anisotropic conductive film to which these electrically conductive particles were added so as to obtain a connection structure. The initial resistance of the connection structure was 0.7Ω, and the resistance after a reliability test was 1.1Ω. The incidence of wire cracking was 0%, and the overall assessment was NG.

Comparative Example 4

As shown in Table 1, a $TiO_2$/Al coated PET substrate and an IC were crimped under crimping conditions for 5 sec at 190° C. and 60 MPa using an anisotropic conductive film to which the same electrically conductive particles as those in Comparative Example 3 were added so as to obtain a connection structure. The initial resistance of the connection structure was 1.8Ω, and the resistance after a reliability test was 3.6Ω. The incidence of wire cracking was 0%, and the overall assessment was NG.

Comparative Example 5

As shown in Table 1, a $TiO_2$/Al coated PET substrate and an IC were crimped under crimping conditions for 5 sec at 190° C. and 100 MPa using an anisotropic conductive film to which the same electrically conductive particles as those in Comparative Example 3 were added so as to obtain a connection structure. The initial resistance of the connection structure was 0.7Ω, and the resistance after a reliability test was 1.0Ω. The incidence of wire cracking was 25%, and the overall assessment was NG.

in Comparative Example 2, the resist. nee after the reliability test increased substantially. Further, when Ni—W—B was formed as an electrically conductive layer and silica having a Mohs' hardness of 7 was used as electrically insulating particles, as in Comparative Example 3, resistance after the reliability test increased. In addition, when a PET substrate was connected using the electrically conductive particles of Comparative Example 2, as in Comparative Example 4, the resistance after the reliability test increased substantially. Further, when the pressure at the time of crimping was made high and a PET substrate was connected, as in Comparative Example 5, it was possible to suppress increases in resistance after the reliability test, but cracking occurred.

On the other hand, when alumina having a Mohs' hardness of 9 was used as electrically insulating particles, as in Examples 1 to 4, it was possible to suppress increases in resistance after the reliability test and to prevent the occurrence of cracking without increasing the pressure at the time of crimping. In addition, it was also possible to achieve low resistance in a PET substrate connection, as in Examples 2 and 4. Further, by forming Ni—W—B as an electrically conductive layer, as in Example 4, it was possible to achieve even lower resistance in a PET substrate connection. These results are due to the fact that since the hardness of the electrically insulating particles is high, the particles pierce the oxide layer of the wiring surface even when the pressure at the time of crimping is not increased, and the points of contact between the wiring wad the electrically conductive particles thereby increase.

REFERENCE SIGNS LIST

10 Resin core particle
20 Electrically insulating particle
30, 31, 32, 33, 34 Electrically conductive layer
40 Electrically conductive particle
41 Resin core particle
42 Electrically insulating particle
50 First circuit member
51 Terminal
52 Oxide layer

TABLE 1

| | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|
| Electrically insulating particles (protrusions) | $Al_2O_3$ | | | | $SiO_2$ | | | | |
| Electrically conductive layer | Ni—B | | Ni—W—B | | Ni—B | | Ni—W—B | | |
| Crimping conditions | 190° C.-60 MPa-5 sec | | | | 190° C.-60 MPa-5 sec | | | | 190° C.-100 MPa-5 sec |
| Evaluation substrate | Glass | PET | Glass | PET | Glass | PET | Glass | PET | PET |
| Initial resistance (Ω) | 0.6 | 0.7 | 0.3 | 0.6 | 1.5 | 3.0 | 0.7 | 1.8 | 0.7 |
| Resistance after reliability test (Ω) | 0.9 | 1.0 | 0.5 | 0.8 | 3.0 | 6.0 | 1.1 | 3.6 | 1.0 |
| Wire cracking incidence (%) | 0 | 0 | 0 | 0 | 0 | 0 | 0 | 0 | 25 |
| Overall assessment | OK | OK | OK | OK | NG | NG | NG | NG | NG |

When Ni—B was formed as an electrically conductive layer and silica having a Mohs' hardness of 7 was used as electrically insulating particles, as in Comparative Example 1, the resistance after the reliability test increased. In addition, when a PET substrate was connected using the electrically conductive particles of Comparative Example 1, as

The invention claimed is:

1. An electrically conductive material comprising:

electrically conductive particles including: resin core particles; a plurality of electrically insulating particles disposed on a surface of the resin core particles and forming protrusions; and an electrically conductive layer disposed on the surface of the resin core particles and a surface of the electrically insulating particles, wherein a Mohs' hardness of the electrically insulating particles is greater than 7, and the electrically conductive layer of the electrically conductive particles is nickel or a nickel alloy;

a first circuit member, the first circuit member being a plastic substrate; and a terminal of the first circuit member, the terminal including an oxide layer, and the terminal being formed on the plastic substrate and being connected to an electrically conductive particle.

2. The electrically conductive material according to claim 1, wherein the electrically insulating particles of the electrically conductive particles are at least one of zirconia, alumina, tungsten carbide, and diamond.

3. The electrically conductive material according to claim 2, wherein the oxide layer is a $TiO_2$ layer.

4. The electrically conductive material according to claim 1, wherein an average particle size of the electrically insulating particles of the electrically conductive particles is from 50 to 250 nm, and a number of protrusions formed on the surface of the resin core particles of the electrically conductive particles is from 1 to 500.

5. The electrically conductive material according to claim 1, wherein a compressive elasticity modulus of the resin core particles of the electrically conductive particles when compressed by 20% is from 500 to 20000 $N/mm^2$.

6. The electrically conductive material according to claim 1, wherein the oxide layer is a $TiO_2$ layer.

7. The electrically conductive material according to claim 1, wherein the first circuit member and the second circuit member being integrated circuits are connected.

8. The electrically conductive material according to claim 1, wherein an elasticity of the plastic substrate is 2000 MPa to 4100 MPa.

9. A connection structure comprising:

a first circuit member, the first circuit member being a plastic substrate;

a second circuit member;

a terminal of the first circuit member and a terminal of the second circuit member are connected by electrically conductive particles, the electrically conductive particles include:

resin core particles;

a plurality of insulating particles disposed on a surface of the resin core particles and forming protrusions; and an electrically conductive layer disposed on a surface of the resin core particles and the electrically insulating particles, a Mohs' hardness of the electrically insulating particles is greater than 7, and the terminal is formed on the plastic substrate and includes an oxide layer.

10. The connection structure according to claim 9, wherein the first circuit member and the second circuit member being integrated circuits are connected.

11. The connection structure according to claim 9, wherein an elasticity of the plastic substrate is 2000 MPa to 4100 MPa.

12. The connection structure according to claim 9, wherein the oxide layer is a TiO2 layer, and the electrically conductive layer of the electrically conductive particles is nickel or a nickel alloy.

13. A production method for a connection structure, comprising:

crimping a terminal of a first circuit member and a terminal of a second circuit member via an electrically conductive material comprising electrically conductive particles, the electrically conductive particles including resin core particles, a plurality of electrically insulating particles disposed on a surface of the resin core particles and forming protrusions, and an electrically conductive layer disposed on a surface of the resin core particles and the electrically insulating particles, a Mohs' hardness of the electrically insulating particles being greater than 7, and the first circuit member being a plastic substrate; and forming the terminal on the plastic substrate, the terminal of the first circuit member including an oxide layer.

14. The production method for a connection structure according to claim 13, wherein the first circuit member and the second circuit member being integrated circuits are connected.

15. The production method for a connection structure according to claim 13, wherein an elasticity of the plastic substrate is 2000 MPa to 4100 MPa.

16. The production method for a connection structure according to claim 13, wherein the oxide layer is a TiO2 layer, and the electrically conductive layer of the electrically conductive particles is nickel or a nickel alloy.

* * * * *